United States Patent [19]
Fouquet et al.

[11] Patent Number: 5,390,210
[45] Date of Patent: Feb. 14, 1995

[54] SEMICONDUCTOR LASER THAT GENERATES SECOND HARMONIC LIGHT WITH ATTACHED NONLINEAR CRYSTAL

[75] Inventors: Julie E. Fouquet, San Carlos, Calif.; Norihide Yamada, Kokubunji, Japan

[73] Assignee: Hewlett-Packard Company, Palo Alto, Calif.

[21] Appl. No.: 156,228

[22] Filed: Nov. 22, 1993

[51] Int. Cl.$^6$ ............................................... H01S 3/08
[52] U.S. Cl. ....................................... 372/92; 372/45; 372/21; 372/22; 437/129
[58] Field of Search ................... 372/92, 45, 21, 98, 372/22; 437/129

[56] References Cited

U.S. PATENT DOCUMENTS

| | | | |
|---|---|---|---|
| 4,951,293 | 8/1990 | Yamamoto et al. | 372/22 |
| 5,247,528 | 9/1993 | Shinozaki et al. | 372/22 |
| 5,253,258 | 10/1993 | Lawandy | 372/22 |
| 5,295,147 | 3/1994 | Jewell et al. | 372/45 |

OTHER PUBLICATIONS

M. J. Angell et al., "Orientation Patterning of II–VI Semiconductor Films for Quasi–phasematched Nonlinear Devices", Optical Society of America, 1992 Technical Digest Series, vol. 10, Mar. 22–24, 1993, Palm Springs, California.
R. J. Ram, et al., "analysis of Wafer Fusing of 1.3um Vertical Cavity Surface Emitting Lasers", Appl. Phys. Lett. 62 (20), 17 May 1993, pp. 2474–2476.
D. Vakhshoori et al., "Blue–Green Surface–Emitting Second Harmonic Generators on (111)B GaAs", Appl. Phys. Lett. 59(8), 19 Aug. 1991, pp. 896–898.
M. A. Haase et al., "Blue–Green Laser Diodes", Appl. Phys. Lett. 59(11), 9 Sep. 1991, pp. 1272–1274.
J. J. Dudley et al., "Low Threshold, electrically injected InGaAsP (1.3 um) Vertical Cavity Lasers on GaAs Substrates", 51st Annual Device Research Conference, Jun. 21–23, 1993, University of California, Santa Barbara, California, IEEE Electron Devices Society.
R. J. Raml et al., "Characterization of Wafer Fusing for Hybrid Optoelectronic Devices", 1993 Electronic Materials Conference, University of California, Santa Barbara, California, Jun. 23–25, 1993, p. A47.

Primary Examiner—Léon Scott, Jr.

[57] ABSTRACT

A semiconductor laser with a nonlinear crystal that generates second harmonic light at a frequency which is twice the fundamental frequency of the laser. The laser is configured in a vertical-cavity, surface-emitting structure or an edge-emitting structure. A nonlinear crystal is attached to a semiconductor optical amplifier by fusing with wafer bonding techniques or by epitaxially growing the nonlinear crystal on the amplifier. The amplifier and the nonlinear crystal are located inside a laser cavity that is defined between a pair of reflectors. One of the reflectors is located adjacent the nonlinear crystal and is highly reflective at the fundamental frequency but transmissive at twice the fundamental frequency. Light is generated at the fundamental frequency, doubled in frequency as it passes back and forth through the nonlinear crystal, and emitted through the reflector adjacent the nonlinear crystal. An optional region between the amplifier and the nonlinear crystal prevents reflections at the fundamental frequency or prevents light at twice the fundamental frequency from propagating from the nonlinear crystal into the amplifier.

35 Claims, 4 Drawing Sheets

SEMICONDUCTOR LASER THAT GENERATES SECOND HARMONIC LIGHT WITH ATTACHED NONLINEAR CRYSTAL

FIELD OF THE INVENTION

The present invention relates generally to lasers and more particularly to a semiconductor laser that generates second harmonic light by means of a nonlinear crystal attached to a semiconductor optical amplifier in the laser cavity.

BACKGROUND OF THE INVENTION

There has been a need for an inexpensive, compact source of blue light for use in applications as diverse as flat displays for computers and entertainment systems, medical devices, analytical instruments, data storage, and optical communications. Blue light has a relatively short wavelength (about 4,700 Angstroms) and has been more difficult to generate than longer-wavelength light such as green light (about 5,200Å), red light (about 6,500Å), or infrared, which extends from about 7,000Å to over 100,000Å.

Some kinds of light-emitting diodes ("LEDs") are capable of emitting blue light. However, LEDs can only emit light over a relatively broad spectrum and therefore are not suitable for applications that require a single wavelength or a narrow range of wavelengths. In addition, the output power of LEDs is too low for many applications. Lasers can generate light at a single wavelength, but most lasers, especially semiconductor lasers, have not been able to generate light with a wavelength as short as that of blue light. For example, lasers fabricated of group III-V semiconductor compounds (usually compounds of gallium, indium or aluminum with arsenic or phosphorus such as AlGaAs or AlGaInP) do not produce significant energy—at room temperature—at wavelengths shorter than about 5,500Å. Other semiconductor light sources are very weak (e.g. silicon carbide), have a very short lifetime (e.g. polymers) or are too soft to work with easily and are not sufficiently reliable (e.g. group II-VI compounds).

A semiconductor laser that can produce blue light was first reported by Hasse et al. in Applied Physics Letters, vol. 59, page 1272 (1991). This device is fabricated of a zinc-cadmium-sulfur-selenium compound and works at an extremely low temperature of 77° K. (−196° C.), not at room temperature. Continuous wave ("CW") devices that work at room temperature with reasonable lifetimes have not been reported.

Another approach is to direct the output of a laser that generates infrared light into a nonlinear device that produces a second harmonic of the infrared light. The second harmonic is twice the frequency, and hence half the wavelength, of the fundamental. For example, infrared light with a fundamental wavelength of 9,400Å has a second harmonic with a wavelength of 4,700Å. The power of the second harmonic is in general proportional to the square of the power of the fundamental, and if the available fundamental power is sufficient a strong second harmonic can be obtained. This approach has been used successfully with continuous-wave solid state lasers such as Nd:YAG. However, laser systems according to this approach have utilized multiple components and therefore have been physically bulky, expensive, and difficult to align. In addition, difficulties with stability and control have been encountered. Laser systems of this kind are described in such references as Yariv, Introduction to Optical Electronics (4th Ed.), Holt, Rinehart & Wilson, 1991; Yamamoto et al., IEEE Journal of Quantum Electronics, Vol. 28, page 1909 (1992); and Tamada et al., Proceedings of OSA Compact Blue-Green Lasers Topical Meeting, Santa Fe, N.M., page 120 (1992).

It is known to fabricate a monolithic device with a second harmonic generating element of a similar semiconductor material inside the cavity of a normal stripe gallium arsenide or aluminum gallium arsenide edge-emitting semiconductor laser. However, the power of the fundamental wave inside such lasers is relatively low due to low end facet reflectivity. Also, these devices have long cavities which result in large absorption losses and phase matching difficulties. These disadvantages have made it impractical to generate useful second harmonic outputs with the desired wavelengths. Lasers of this kind are described in such references as Ogasawara et al., "Second Harmonic Generation in an AlGaAs Double-Heterostructure Laser", Japanese Journal of Applied Physics, Vol. 26, page 1386 (1987).

Monolithic surface-emitting devices having nonlinear regions have also been proposed. One such device, described by Vakhshoori et al., Applied Physics Letters, Vol. 59, page 896 (1991), has relatively low output power for the same reasons as the edge-emitting device. Moreover, the emitted light is distributed over a wide angular range and therefore is difficult to condense.

A more promising approach is described in copending U.S. patent application Ser. No. 08/047,969, filed Apr. 15, 1993 and assigned to the same assignee as the present application. This approach utilizes a vertical-cavity surface-emitting laser ("SEL"). The SEL is made of group III-V semiconductor material and is particularly fabricated to utilize certain nonlinear optical characteristics of the III-V material itself for frequency doubling purposes. This approach takes advantage of the relatively high power that is present inside the active region of an SEL. However, this approach requires a non-standard substrate orientation which may be difficult to manufacture, and the output power is limited by absorption in the semiconductor material of light at the doubled frequency.

It will be apparent from the foregoing that there is still a need for a compact, efficient semiconductor laser that can generate blue light.

SUMMARY OF THE INVENTION

The present invention provides a semiconductor laser that includes a semiconductor optical amplifier region and an attached nonlinear crystal. Red or infrared light generated by the laser is doubled in frequency by the crystal and emitted as green, blue or ultraviolet light. The laser is compact, stable, efficient and easy to manufacture.

Briefly and in general terms, a laser according to the invention includes a first reflector, a semiconductor optical amplifier adjacent the first reflector, a nonlinear crystal for second harmonic generation connected to the amplifier, and a second reflector adjacent the nonlinear crystal. The reflectors define a laser cavity that extends from the first reflector through the amplifier and the nonlinear crystal to the second reflector.

In operation, the amplifier generates and amplifies red or infrared light at a certain fundamental frequency. The light passes back and forth through the amplifier and the nonlinear crystal, building in power. The second reflector, although it is highly reflective of light at the fundamental frequency, is transmissive of light at twice the fundamental frequency. Some of the light is doubled in frequency as it passes through the crystal, and this light is emitted through the second reflector to form an output beam of blue light at twice the fundamental frequency.

In one embodiment the nonlinear crystal is fused (wafer bonded) to the amplifier. In another embodiment the nonlinear crystal is epitaxially grown on the amplifier. The nonlinear crystal preferably comprises a dielectric such as lithium niobate or lithium tantalate or a semiconductor such as AlGaInP, AlGaInBN, AlGaInAs, AlGaAs, or MgCdZnSSe (or a simpler compound).

The reflectors are preferably over 90% reflective at the fundamental-frequency. The second reflector is preferably more than 50% transmissive of light at twice the fundamental frequency.

In one embodiment an anti-reflective coating or the like is placed between the amplifier and the nonlinear crystal to minimize any reflection of fundamentalfrequency light at the boundary between the amplifier and the nonlinear crystal. Alternatively, the coating at this location may function as a third reflector, reflective at twice the fundamental frequency but transmissive at the fundamental frequency to reflect as much frequency-doubled light as possible toward the output. Of course, the coating may be designed to accomplish both functions.

The invention is preferably embodied in a vertical-cavity surface-emitting laser ("SEL") structure. One such structure is fabricated by, first, epitaxially growing the first reflector on one side of a substrate. The amplifier is epitaxially grown on the first reflector. A contact layer is formed on a side of the amplifier opposite the first reflector. The nonlinear crystal is attached to part of the contact layer, or an opening is etched through the contact layer to permit the nonlinear crystal to be attached directly to the amplifier. A first electrode is formed on the substrate and a second electrode is formed on the contact layer such that the amplifier, the first reflector and the substrate lie between the two electrodes.

Another SEL structure embodying the invention is similar except that the amplifier is grown directly on the substrate. The first reflector may be deposited on the substrate opposite the amplifier, or an opening may be etched through the substrate to the amplifier and the first reflector may then be deposited through this opening onto the amplifier.

In still another SEL structure embodying the invention, the contact layer is grown on the nonlinear crystal rather than on the amplifier, and the second reflector is deposited on the nonlinear crystal through an opening in the contact layer.

The invention may also be embodied in an edge-emitting laser structure. One such structure is fabricated by epitaxially growing the amplifier on a substrate and then forming a contact layer on the amplifier. A contacting stripe may be defined on the contact layer using lithographic techniques. Opposite edges of the structure are cleaved and the nonlinear crystal is attached to one of the cleaved edges. A first electrode is placed adjacent the substrate and a second electrode is placed adjacent the contact layer such that the amplifier and the substrate lie between the two electrodes. The first reflector is formed on the remaining cleaved edge. The second reflector is formed on the nonlinear crystal.

Other aspects and advantages of the invention will become apparent from the following derailed description, token in conjunction with the accompanying drawings, illustrating by way of example the principles of the invention.

DESCRIPTION OF THE PREFERRED EMBODIMENT

As shown in the drawings for purposes of illustration, the invention is embodied in a semiconductor laser having a nonlinear crystal attached to a semiconductor optical amplifier. The laser generates infrared or other relatively long-wavelength light. The crystal doubles the frequency of the light produced by the laser and thereby provides blue or other relatively short-wavelength light. There has been a need for a reliable, economical and compact laser that can provide blue light, but existing approaches have not been satisfactory.

In accordance with the invention, the nonlinear crystal is attached to the semiconductor amplifier by fusing or by epitaxial growth. The amplifier and attached crystal are located in a laser cavity between a pair of reflectors. The crystal doubles the frequency of light generated by the laser, and the frequency-doubled light is emitted through the reflector that is adjacent the crystal.

A laser that embodies the principles of the invention can be manufactured easily and economically. The laser provides a compact, stable source of blue light. Internal absorption of the blue light may be minimized by fabricating the nonlinear crystal of a material characterized by low absorption at blue light frequencies.

Figure 1:
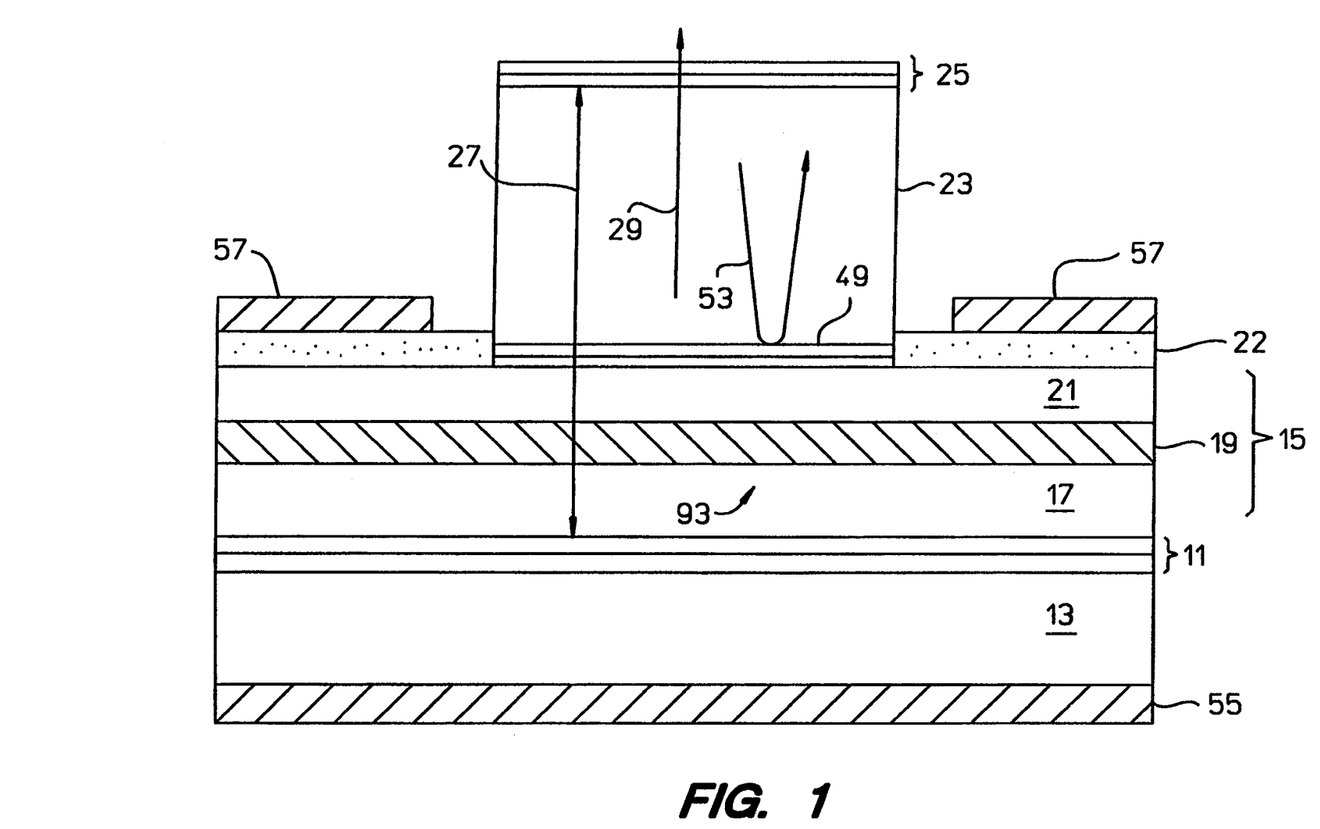
FIG. 1 is a cross-sectional view of a vertical-cavity, surface-emitting laser embodying the principles of the invention.
Figure 2:
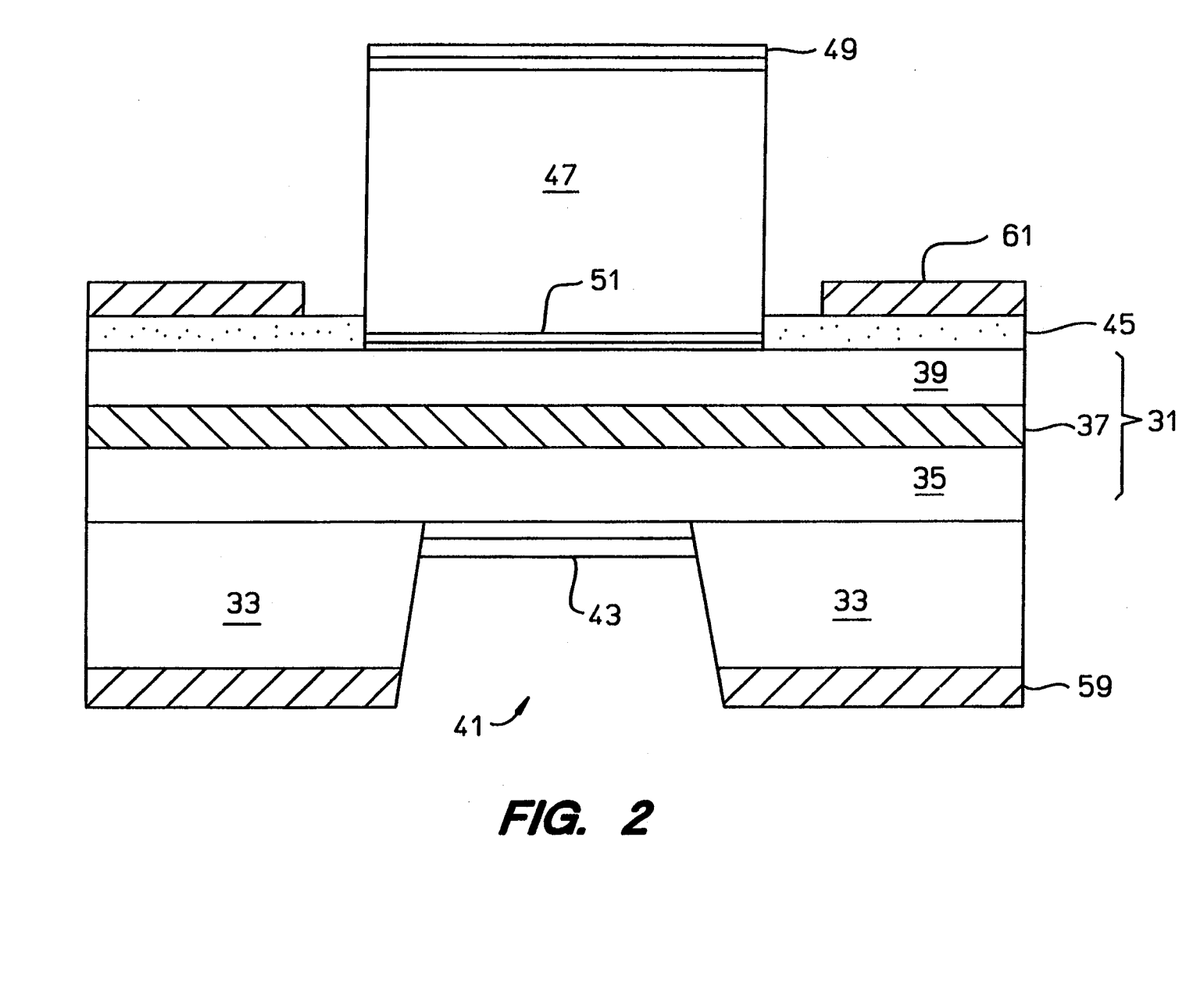
FIG. 2 is a cross-sectional view of an alternate embodiment of a vertical-cavity, surface-emitting laser embodying the principles of the invention.
Figure 3:
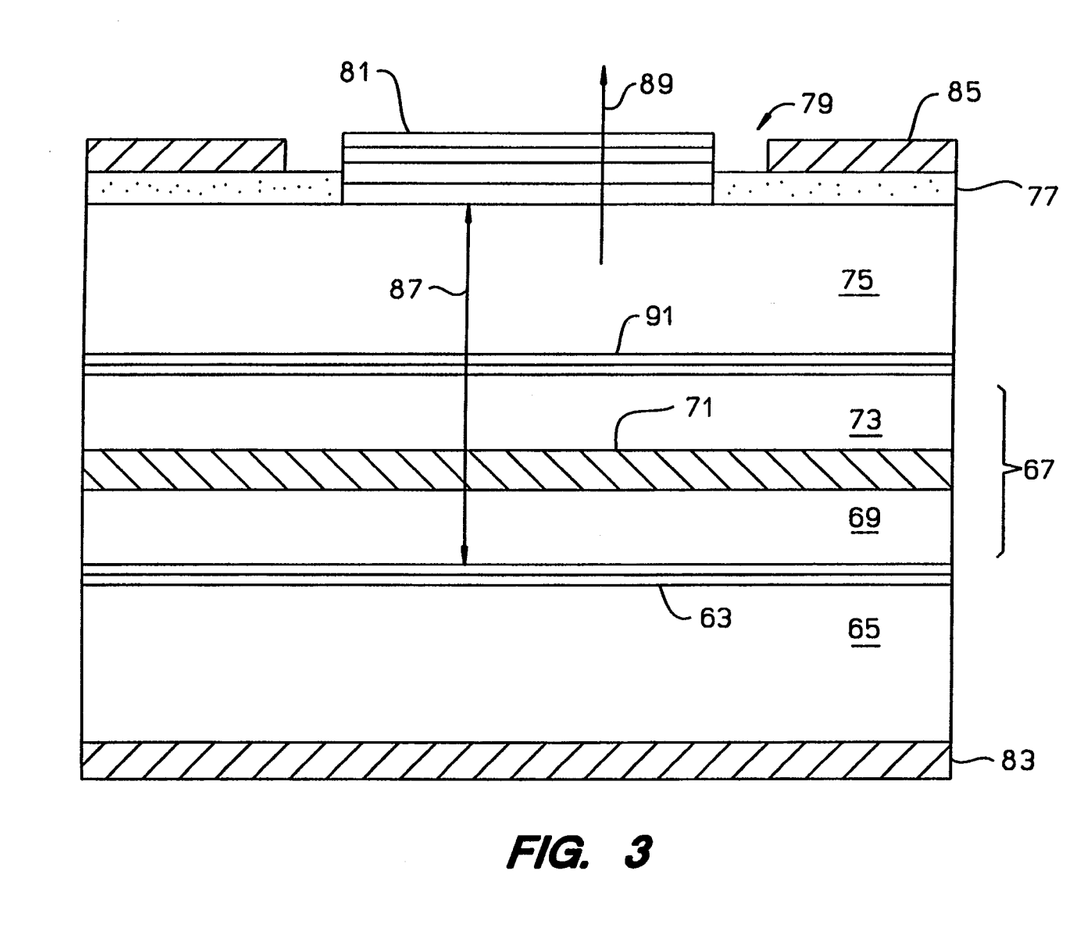
FIG. 3 is a cross-sectional view of another embodiment of a vertical-cavity, surface-emitting laser embodying the principles of the invention.

The invention is preferably embodied in a vertical-cavity surface-emitting laser ("SEL") structure. Typical SEL structures in which the invention may be embodied are illustrated in FIGS. 1 through 3. In the structure shown in FIG. 1, a first reflector 11 is epitaxially grown on a substrate 13. The first reflector preferably comprises a Bragg mirror or the like. The first reflector is reflective of light at a desired fundamental frequency, typically a deep red or infrared frequency. The first reflector is fabricated of a material such as AlGaAs (aluminum gallium arsenide), AlAs or GaAs; the specific material is selected to minimize electrical resistivity and to minimize optical absorption at the fundamental frequency.

A semiconductor optical amplifier 15 is grown on the first reflector 11. The amplifier typically includes a lower spacer layer 17, an active region 19, and an upper spacer layer 21. The active region 19 may contain quantum wells. A contact layer 22 is formed on the upper spacer layer 21, usually by growing a heavily doped lower-bandgap material on the spacer layer 21. An opening is etched through the contact layer 22 and a nonlinear crystal 23 is attached to the amplifier 15 opposite the first reflector 11 by techniques to be described in more detail presently. Depending on the specific materials and geometry selected by the designer, it may be possible to omit the contact layer. Alternatively, it may be possible to omit the step of etching an opening and instead attach the nonlinear crystal to the contact layer.

A second reflector 25, reflective of light at the fundamental frequency and transmissive of light at twice the fundamental frequency, is deposited on the nonlinear crystal 23. The second reflector 25 comprises a dielectric quarter wave mirror stack that is reflective of light at the fundamental frequency but transmissive at twice the fundamental frequency.

The first and second reflectors 11 and 25 define a laser cavity at the fundamental frequency, generally indicated by an arrow 27, that extends from the first reflector 11 through the amplifier 15 and the nonlinear crystal 23 to the second reflector 25. The laser is responsive to an external energy source to generate light in the laser cavity at the fundamental frequency. Typically the external energy source comprises an electric current and the laser is doped to be a forward-biased P-N junction. The nonlinear crystal 23 doubles the frequency of the generated light and thereby provides a beam of frequency-doubled light through the second reflector 25 as indicated by an arrow 29.

The embodiment shown in FIG. 2 is generally similar to that shown in FIG. 1 except that the semiconductor optical amplifier is grown directly on the substrate without an intervening reflector. More particularly, a semiconductor optical amplifier 31 is grown on a substrate 33. The amplifier 31 includes a lower spacer layer 35, an active region 37, and an upper spacer layer 39.

A contact layer 45 is formed on the upper spacer layer 39. An opening is etched through the contact layer 45 and then a nonlinear crystal 47 is attached to the amplifier 31 (as with the embodiment shown in FIG. 1, it may be possible to omit the contact layer, or the nonlinear crystal may be attached to the contact layer without etching a hole). An opening 41 is etched through the substrate 33 and a first reflector 43, typically a quarter-wave dielectric stack, is deposited in the opening onto the lower spacer layer 35. In an alternate embodiment, no opening is etched through the substrate; instead, the substrate is mechanically polished and the first reflector 43 is deposited on the polished substrate. Then a second reflector 49 is deposited on the nonlinear crystal 47.

The higher the reflectivities of the first and second reflectors at the fundamental frequency, the better will be the performance of the laser at the fundamental frequency. These reflectors are preferably characterized by reflectivities of more than ninety percent at the fundamental frequency, although in some cases satisfactory operation is attainable with lower reflectivities. On the other hand, the second reflector should be as transmissive as possible at twice the fundamental frequency so as to permit as much as possible of the frequency-doubled light to be emitted. A transmissivity of over fifty percent is desirable.

Preferably, the nonlinear crystal is fused to the upper spacer layer of the optical amplifier. Fusing refers to a procedure in which two materials with flat surfaces are pressed together and heated, sometimes in a controlled atmosphere, to make an atomic-level bond. The fused materials behave as one both mechanically and electrically. Fusing makes it possible to bond together two materials with unmatched structures, for example different crystal structures or different lattice parameters. GaAs and InP are examples of unmatched materials that may be joined together by fusing.

Alternatively, the nonlinear crystal is epitaxially grown on the upper spacer layer. For example, oxide growth techniques may be used to grow a dielectric oxide nonlinear crystal on a semiconductor laser structure. Furthermore, crystal orientation-controlled techniques may be used to grow a non-linear crystal having a certain crystal orientation on a laser structure having another crystal orientation; this technique has been mentioned in Angell et al., "Orientation Patterning of II–VI Semiconductor Films for Quasiphasematched Nonlinear Devices", Summaries of papers presented at the Integrated Photonics Research Topical Meeting, Mar. 22–24, 1993, Palm Springs, Calif., page 472.

The nonlinear crystal preferably comprises a dielectric such as $LiNbO_3$ (lithium niobate) or $LiTaO_3$ (lithium tantalate) or a semiconductor such as AlGaAs, AlGaInP, AlGaInAs, AlGaInBN, or MgCdZnSSe. Of course, it will be understood throughout this description that a reference to one or more specific compounds should not be understood as excluding other similar compounds, and that a reference to one compound should be understood as including simpler compounds; for example, a reference to AlGaAs should be understood as including simpler compounds such as GaAs.

Optionally, an additional layer 49 (in FIG. 1) or 51 (in FIG. 2) is located between the amplifier and the nonlinear crystal. This additional layer preferably has anti-reflective properties at the fundamental frequency to minimize any reflection of fundamental-frequency light propagating across the boundary between the amplifier and the nonlinear crystal. In addition to or instead of its anti-reflective properties at the fundamental frequency, the additional layer is reflective of light at twice the fundamental frequency so as to reflect toward the second reflector any frequency-doubled light propagating from the nonlinear crystal toward the amplifier, as indicated by an arrow 53 in FIG. 1.

Referring again to FIG. 1, a first electrode 55 is located adjacent the substrate 13 and a second electrode 57 is located on the contact layer 22 opposite the first electrode 55 such that the amplifier 15 is between the two electrodes. The second electrode 57 is annular in shape to permit light from the amplifier to pass into the nonlinear crystal. Actually, in the illustrated embodiment the second electrode 57 encircles the nonlinear crystal 23, and the nonlinear crystal projects above the second electrode.

As was discussed previously, under some circumstances it may be desirable to omit the contact layer 22. If the contact layer is omitted, the second electrode is formed directly on the upper spacer layer 21. This would be done if a sufficiently low electrical resistance between the electrode and the upper spacer layer could be obtained without a contact layer.

A first electrode 59 and a second electrode 61 in the embodiment shown in FIG. 2 are similar to the first and second electrodes 55 and 57, respectively, as shown in FIG. 1, except that the first electrode 59 is annular in shape.

The embodiment shown in FIG. 3 is generally similar to that shown in FIG. 1 except that the electrode is formed on the nonlinear crystal rather than on the amplifier (of course, this assumes that the nonlinear crystal is capable of conducting sufficient electrical current). More particularly, a first reflector 63 is grown on a substrate 65 and a semiconductor optical amplifier 67, having a lower spacer layer 69, an active region 71, and an upper spacer layer 73, is grown on the first reflector. A nonlinear crystal 75 is fused to, or epitaxially grown on, the amplifier 67. A contact layer 77 is formed on the nonlinear crystal, an opening 79 is etched through, and a second reflector 81 is formed in the opening on the nonlinear crystal. First and second electrodes 83 and 85 complete the structure. A laser cavity is defined between the first and second reflectors as indicated by an arrow 87, and light at twice the fundamental frequency is emitted through the second reflector as indicated by an arrow 89. A region 91 may serve as an anti-reflectance coating between the amplifier and the nonlinear crystal, or as a reflector for light at twice the fundamental frequency, or both.

It will be apparent that various other configurations of the optical amplifier and the electrodes may be employed as will be apparent to those skilled in the design of surface-emitting lasers.

The lower and upper spacer layers 17 and 21 are fabricated of any material that can be grown in a double heterostructure with the active region. The active region 19 is made of a lower-bandgap material than the spacer layers; any material with a direct bandgap such as AlGaAs, GaAs, InGaAs (indium gallium arsenide), AlGaInAs, AlInGaP or AlGaInBN may be used. Group II-VI compound semiconductor materials such as MgCdZnSSe may also be used.

The lower spacer layer 17 should preferably be located so as to position the gain region 19 of the amplifier 15 at an antinode of a resonance near the gain peak wavelength for maximum efficiency. It may be possible to support multiple resonances on the gain curve. Electrical current is supplied to the laser through the first electrode 55 and the annular-shaped second electrode 57. The upper spacer layer 21 should be thick enough to distribute the electrical current reasonably uniformly in the active region 19 of the amplifier 15.

It is desirable that as much current as possible flow through that portion of the amplifier which lies beneath the nonlinear crystal for optimal efficiency and lateral mode control. Current flow may be directed under the nonlinear crystal by blocking current flow through that portion of the amplifier which lies beneath the second electrode, for example by proton implantation.

A metal contact (not shown) may be positioned adjacent the amplifier 15 to facilitate heat dissipation.

The physical dimensions of the various components are conventional and will be apparent to those with skill in the art. The nonlinear crystal is preferably between about one micrometer and one millimeter thick. If the power output of the laser at the fundamental frequency is sufficiently high, the nonlinear crystal may be thinner than one coherence length, thereby eliminating any need for phase matching. Otherwise, phase matching is satisfied either by quasi-phase matching ("QPM") (realized by poling when the crystal is grown) or birefringence. Non-critical phase matching is preferred in order to reduce temperature sensitivity and obtain greater angular tolerance. Actual phase matching strategy will be determined by the refractive index and nonlinearity characteristics of the nonlinear crystal.

If the nonlinear crystal is relatively thick, resulting in a long second harmonic generation region, mode confinement may be desirable. This may be accomplished by means of a refractive index waveguide in the crystal or by etching or polishing a lens on the nonlinear crystal before depositing the second reflector.

Figure 4:
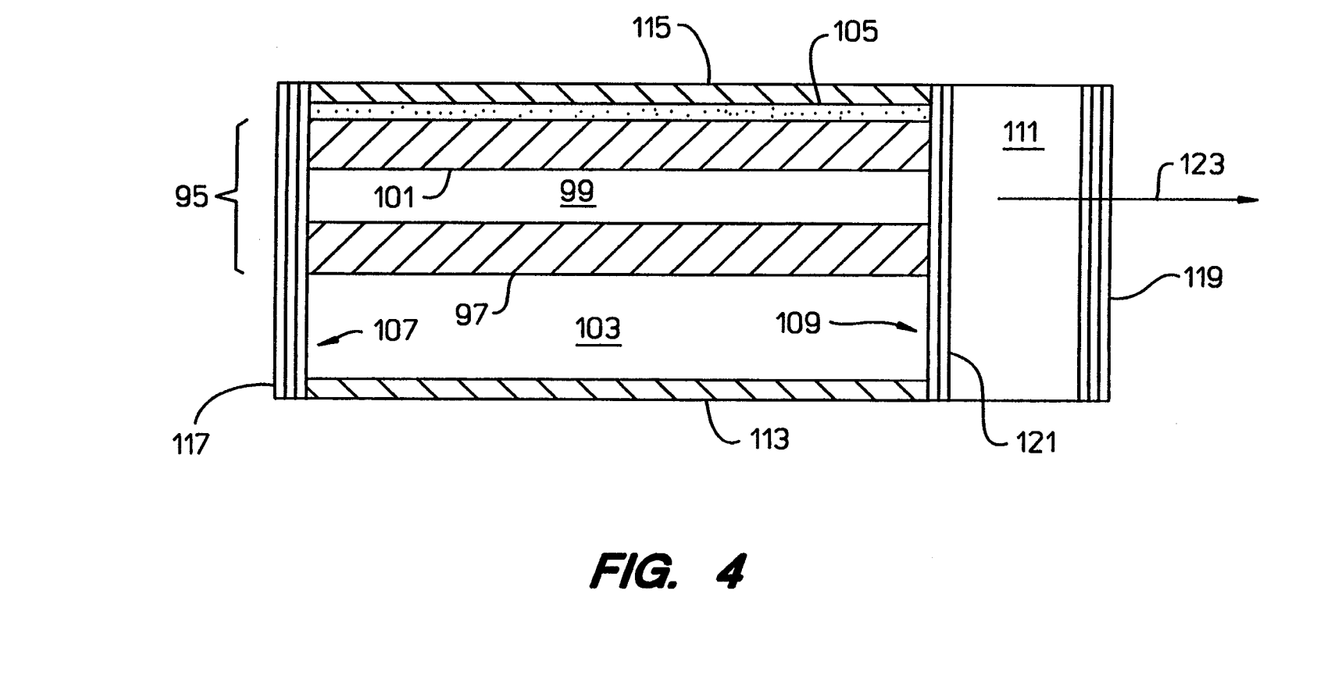
FIG. 4 is a cross-sectional view of an edge-emitting laser embodying the principles of the invention.

An alternate embodiment is shown in FIG. 4. In this embodiment the various components are configured to define an edge-emitting laser. A semiconductor optical amplifier 95 comprising a lower cladding layer 97, an active region 99 and an upper cladding layer 101 is epitaxially grown on a substrate 103. A contact layer 105 is formed on the upper cladding layer 101 and a contacting stripe (not shown) may be defined using lithographic techniques. Opposite edges 107 and 109 are cleaved. A nonlinear crystal 111 is attached to the cleaved edge 109. First and second electrodes 113 and 115 are formed on the substrate and on the contact layer, respectively, and first and second reflectors 117 and 119 are deposited on the cleaved edge 105 and on the nonlinear crystal. Similar to the embodiment shown in FIG. 1, the reflectors 117 and 119 define a laser cavity which is occupied by the amplifier 95 and the nonlinear crystal 111. An anti-reflective coating or a third reflector may be included in a region 121 as desired. Blue light is emitted through the second reflector as indicated by an arrow 123.

The importance of using a highly transmissive material to make the nonlinear crystal will now be discussed. If the crystal is well phase-matched, if focusing is well-optimized, and if conversion efficiency to the second harmonic is relatively low, then after a single pass:

$$P_{2\omega} = \frac{1024\pi^5 L_{SHG} d^2 \cdot 1.068 (P_\omega)^2}{n_\omega n_{2\omega} (\lambda_\omega)^3 C} \propto (P_\omega)^2 L_{SHG}$$

where $P_{2\omega}$ is the optical power at the second harmonic wavelength (at the end of the crystal, in ergs), $P_{107}$ is the optical power at the fundamental wavelength (after the semiconductor gain section, in ergs), d is the applicable nonlinear coefficient of the crystal (in cgs units), $L_{SHG}$ is the phasematched length of the crystal (in cm), c is the speed of light in cm/sec, $n_\omega$ is the refractive index at the fundamental wavelength, $n_{2\omega}$ is the refractive index at the second harmonic wavelength, and $\lambda_\omega$ is the fundamental wavelength. See Zernike et al., Applied Nonlinear Optics, New York, John Wiley and Sons, 1973, p. 106. If the crystal absorbs at the second harmonic wavelength, not all of the second harmonic radiation will exit the device. To a first approximation, assume that the second harmonic is generated in the middle of the crystal and travels a distance $L_{SHG}/2$ to reach the output facet of the device. Then the second harmonic power emitted from the device, $(P_{2\omega})^{out}$ is:

$$(P_{2\omega})^{out} \approx P_{2\omega}(-\alpha_{2\omega \cdot SHG} L_{SHG}/2)$$
$$(1 - R_{f \cdot 2\omega}) \propto (P_\omega^2 L_{SHG} \exp(-\alpha_{2\omega \cdot SHG} L_{SHG}/2)$$
$$(1 - R_{f \cdot 2\omega})$$

where $\alpha_{2\omega \cdot SHG}$ is the absorption coefficient at the second harmonic wavelength inside the crystal in cm$^{-1}$ and $R_{f \cdot 2\omega}$ is the power reflectivity of the second reflector 25 (in FIG. 1) at the second harmonic wavelength. Thus for a given fundamental power $P_\omega$ the maximum second harmonic output is obtained when $R_{f \cdot 2\omega}$ is minimized and the quantity:

$$L_{SHG} \exp(-\alpha_{2\omega \cdot SHG} L_{SHG}/2)$$

is maximized. Setting the derivative of this expression equal to zero:

$$\frac{d(L_{SHG}\exp(-\alpha_{2\omega\cdot SHG}L_{SHG}/2))}{dL_{SHG}} = 0$$

yields the relationship $$L_{SHG} = \frac{2}{\alpha_{2\omega\cdot SHG}}$$

For a semiconductor, $\alpha_{2\omega\cdot SHG}$ can range from less than one (for light below the direct bandgap) to as much as $10^5$ (for light above the direct bandgap). For a typical direct semiconductor such as AlGaAs, $\alpha_{2\omega\cdot SHG} \approx 2\cdot 10^4$ cm$^{-1}$, $L_{SHG} = 1$ μm and $$L_{SHG}\exp(-\alpha_{2\omega\cdot SHG}L_{SHG}/2) \approx 4\cdot 10^{-5} \text{ cm}.$$

In contrast, for a standard dielectric medium $\alpha_{2\omega\cdot SHG} < 0.2$ cm$^{-1}$, so $L_{SHG} > 10$ cm. This length is too long to be practical, so a length of 1 mm will be used instead. Then $$L_{SHG}\exp(-\alpha_{2\omega\cdot SHG}L_{SHG}/2) \approx 0.1 \text{ cm}.$$

Therefore the term $$L_{SHG}\exp(-\alpha_{2\omega\cdot SHG}L_{SHG}/2)$$

and hence the emitted second harmonic power will be over $2\cdot 10^3$ times greater for a nonlinear crystal (for example, a typical dielectric) which transmits the second harmonic than for a typical semiconductor with a bandgap below the second harmonic photon energy. This difference is generally larger than the difference between the nonlinear coefficients of the various good candidate semiconductor and dielectric crystals.

A good thermal expansion match should allow the fused device to survive greater extremes in temperature. A related semiconductor is more likely to have a thermal expansion coefficient similar to the semiconductor laser section generating the fundamental wavelength than is a dielectric crystal. GaP and AlP transmit green light and could be a good choice for the crystal. AlP and GaN transmit shorter green wavelengths, and AlN and BN transmit blue. Several Group II–VI compound semiconductors also transmit green and blue light. Even though $\alpha_{2\omega\cdot SHG} > 0.2$ cm$^{-1}$ in such a semiconductor second harmonic generation region, it will still generally be much less than $2\cdot 10^4$. Such a material at an orientation having a high nonlinear coefficient is usually difficult to grow on a common orientation laser but is readily attached by fusion bonding.

The advantages of using a laser with a long gain length will now be discussed. Taking the second harmonic output directly from the nonlinear crystal, as is done in the embodiments shown in all three figures, avoids any loss that would occur due to absorption of the second harmonic in the semiconductor optical amplifier if the second harmonic had to pass through the amplifier. The second reflector should be extremely reflective at the fundamental wavelength but highly transmissive at the second harmonic wavelength. As discussed previously, a multilayer evaporated mirror coating deposited on the nonlinear crystal is preferably used as the second reflector. Either a grown Bragg reflector (such as the first reflector 11 in FIG. 1) or a multilayer coating (such as the first reflector 43 in FIG. 2 or 117 in FIG. 4) of which most layers will probably be dielectric materials, is preferably used as the first reflector. The Bragg mirror has the advantage of conducting heat away from the amplifier more efficiently.

The first reflector should be extremely highly reflective at the fundamental wavelength. If any significant amount of the second harmonic reaches the first reflector, the first reflector would preferably be reflective at the second harmonic wavelength as well. Of course, if the second harmonic is absorbed in the optical amplifier, reflectivity of the first reflector at the second harmonic wavelength is not important.

For the laser to oscillate, the net gain must equal the net losses at the fundamental wavelength:

$$R_f R_b \exp(2(gL_g - \alpha_s L_s - \alpha_{\omega\cdot SHG}L_{SHG}))(1-C)^2 = 1$$

where $R_f$ is the power reflectivity of the "front" (second) reflector, $R_b$ is the power reflectivity of the "back" (first) reflector, g is the gain in cm$^{-1}$, $L_g$ is the length of the active gain region (the distance between the near edges of the lower and upper spacer layers in FIGS. 1, 2 and 3, the distance between the cleaved ends in FIG. 4) in cm$^{-1}$, $\alpha_s$ is the loss in the amplifier region (e.g. due to scatter and free carrier absorption in the cladding or confining layers of the amplifier) in cm$^{-1}$, $L_s$ is the length of the amplifier region (the distance between the first reflector and the nonlinear crystal) in cm ($L_s$ must be greater than $L_g$ in an SEL and $L_s = L_g$ in an edge-emitting laser), $\alpha_{\omega SHG}$ is the loss at the fundamental wavelength in the nonlinear crystal in cm$^{-1}$ (includes scatter and diffraction), $L_{SHG}$ is the length of the nonlinear crystal in cm, and C is the power conversion efficiency to the second harmonic for a single pass; using the terminology and conditions above, $C = P_{2\omega}/P_\omega$.

The equation above is a standard laser threshold condition modified to recognize that converting photons from the fundamental to the second harmonic wavelength constitutes a loss at the fundamental wavelength which affects the performance of the device. In addition, simple losses at the fundamental wavelength such as scatter, diffraction and possible absorption will also hinder the laser in reaching threshold. This analysis ignores, to first order, absorption of the backward second harmonic as an excitation source at the fundamental wavelength.

Under extremely favorable conditions in an SEL, $R_f = R_b = 0.998$, $g = 250$, $L_g = 0.3\cdot 10^{-4}$, and $\alpha_s = \alpha_{\omega\cdot SHG} = 0$. Then the device will not lase unless $C < 0.070$, and C must be even smaller to bring the laser comfortably above threshold. Practical conditions will be less favorable and thus conversion efficiency will have to be lower for oscillation to be achieved. If the nonlinear crystal is a direct semiconductor which absorbs at the fundamental wavelength, then $\alpha_{\omega\cdot SHG} \approx 10^4$ cm$^{-1}$ and the device will not lase for any reasonable length of the nonlinear crystal. Thus it is critical that the nonlinear crystal transmit the fundamental wavelength. If the crystal is lossy at the second harmonic wavelength, a second harmonic output will exist but will be greatly reduced, as described in an earlier section of this memo.

The designer needs to optimize power at the second harmonic wavelength. In situations where C must be very low, the conversion efficiency need not be high, but loss at the fundamental wavelength must be minimized. Thus proper phase matching will probably not be necessary, and the nonlinear crystal can be very short.

If a nonlinear crystal is used which is transmissive at the second harmonic wavelength, and if other conditions are extremely favorable, the high circulating power inside the laser could yield a reasonable amount of second harmonic output power (perhaps up to about tens of milliwatts) despite the low limits on conversion efficiencies. The main limiting factor in the laser threshold equation is the short length of the amplifier. Without a good transverse junction stripe technology, it is currently very difficult to obtain a longer amplifier region in a vertical geometry, and transverse junction stripe technology is highly problematic.

If an edge-emitting geometry is used, as in the embodiment shown in FIG. 4, the length of the amplifier gain region can be much greater and thus the output power can be greatly increased. For example, for an amplifier region with a length of 0.5 cm, C can be close to unity and the laser will still oscillate. This extra gain can make up for a large amount of practical losses and still yield a very bright output, potentially on the order of several watts. In this embodiment the first reflector 117 should have high reflectance at the fundamental wavelength and most ideally would be a multilayer film stack (with a dielectric adjacent the amplifier to prevent shorting the active region 99), but other designs are also possible. Reflectivity of the first reflector at the second harmonic wavelength is probably irrelevant because the second harmonic will probably be absorbed in the amplifier before ever reaching the first reflector. The second reflector 119 should ideally be highly reflective at the fundamental wavelength and highly transmissive at the second harmonic wavelength. A multilayer film stack is a preferred way to meet this objective.

For a given laser power at the fundamental wavelength, there is an optimal conversion efficiency to the second harmonic which lies between a very low value, which converts too small a fraction of the fundamental into second harmonic, and a very high value, which converts too large a fraction of the fundamental to second harmonic and thus overcouples the laser. Conversion efficiency is proportional to fundamental power; therefore the device should tend to correct itself. However, a careful design should yield higher steady state output power. Assuming the laser is oscillating at the fundamental wavelength, the rate equations describing this behavior are approximately as follows (these are modified versions of equations found at page 116 of Zernike et al.):

$$\frac{dn}{dt} = \frac{J}{ed} - B_{stim}nq - r_{nr}n - r_{spon}n$$

$$\frac{dq}{dt} = B_{stim}nq - K_{scat}q - K_{oc}q - K_{SH}q^2$$

where n is the electron density in $cm^{-3}$, t is time, q is the density of photons by stimulated emission only at the fundamental wavelength in $cm^{-3}$, J is the areal current density to the active region, e is the charge per electron, d is the thickness of the active region in cm, $B_{stim}$ is the stimulated emission rate in $cm^3/sec$, $r_{nr}$ is the nonradiative recombination rate in $sec^{-1}$, $r_{spon}$ is the spontaneous emission rate, $K_{scat}$ represents internal losses at the fundamental wavelength within both the fundamental and nonlinear sections, $K_{OC}$ represents the loss due to transmission of the fundamental through the reflectors, and $K_{SH}$ represents the loss at the fundamental wavelength due to conversion to the second harmonic (photon conversion, not power conversion as C above). For high quality material assume $r_{nr}=0$ and for high reflectivities at the fundamental wavelength assume $K_{OC}=0$. At steady state, the time derivatives in the above equations are zero, which results in $$0 = \frac{J}{ed} - B_{stim}n_0q_0 - r_{spon}n_0$$

$$0 = B_{stim}n_0 - K_{scat} - K_{SH}q_0$$

which can be solved for the equilibrium photon density $q_0$.

The second harmonic power $W_{2\omega}$ (not including focusing effects) is the product of the rate of second harmonic photon generation times the energy per photon hv:

$$W_{2\omega} = K_{SH}(q_0)^2 hv$$

As previously discussed, in both the vertical and edge-emitting designs it may be useful to add a coating having anti-reflective behavior at the fundamental wavelength between the amplifier and the nonlinear crystal so that reflections from this interface do not create additional optical cavities within the desired cavity. This coating can be a single layer or multilayer film stack. In the edge-emitter configuration, if a multilayer stack is used, the film closest to the amplifier should be a dielectric to prevent shorting the active region. In other designs no coating, or even a higher reflectivity coating, may be desired because coupled optical cavities have been found to be beneficial in certain applications, for example obtaining single longitudinal mode operation in edge-emitting lasers.

In order to stably oscillate, a laser generally needs some sort of transverse optical mode control. Edge-emitting semiconductor lasers generally contain refractive index waveguides to accomplish this goal, while bulk lasers (not semiconductor lasers) utilize thermal lensing in solid state laser media or concave mirrors (or both). For long nonlinear crystals, waveguiding in the amplifier may not be sufficient; in such a situation it would be desirable to add some sort of mode control in the nonlinear crystal. This control may be provided either by applying waveguide generation techniques such as those used in $LiNbO_3$ electro-optic devices or by creating a curved reflector as the front output coupler mirror by techniques such as polishing or etching.

The process by which the semiconductor optical amplifier structure is preferably attached to the nonlinear crystal is alternately called fusion or wafer bonding. In this process, two clean material samples (the amplifier and the nonlinear crystal) are put together in the orientation desired for the final structure. A good strategy for cleaning these materials is to prepare them as if another semiconductor were to be subsequently grown on them; they should be degreased and oxides should be removed. It is preferable to position two semiconductors such that their major crystal axes are parallel to one another, rather than at some oblique angle. Parallel alignment may be desirable even if the nonlinear crystal is not a semiconductor.

Static pressure is then applied in a direction perpendicular to the interface between the materials. It is preferable to apply a relatively even pressure across this interface. The pressure should be applied by a device which can tolerate the heat required for fusion, for example a graphite press. In order to control and reproduce the pressure, a torque wrench can be used to tighten the press; other methods are also possible. The samples, now compressed, are heated to a high enough temperature for fusion to take place.

The pressure will change somewhat compared to the pressure applied at room temperature due to the difference in thermal expansion between the samples and the press. Appropriate methods may be used to maintain a constant pressure regardless of temperature.

It is preferable to carry out the heating in a controlled atmosphere. Good conditions for fusing certain pairs of semiconductor materials (e.g. AlGaAs grown on GaAs to InGaAs grown on InP) are a pressure of about 300 grams per square centimeter, a temperature of 650° Celsius, a time of 30 minutes, and a hydrogen gas ambient. See, for example, R. J. Ram, J. J. Dudley, L. Yang, K. Nauka, J. Fouquet, M. Ludowise, Y. M. Houng, D. E. Mars and S. Y. Wang, "Characterization of Wafer Fusing for Hybrid Optoelectronic Devices," Electronic Materials Conference, Santa Barbara, Calif., Jun. 23–25, 1993.

Optimal conditions will depend on the particular materials used. For example, if too much phosphorus evaporates from a P-containing crystal before the fusion is complete, phosphine gas can be added to the hydrogen ambient to maintain a proper P-containing crystal structure. In some circumstances the fusing process may be enhanced by growing a thin indium-containing layer on one of the surfaces to be fused prior to carrying out the fusing.

From the foregoing it will be appreciated that the laser provided by the invention meets the need for an economical source of coherent light at shorter wavelengths than have heretofore been attained. The laser is easy to manufacture using conventional techniques, and it operates efficiently to provide light at green to ultraviolet wavelengths and beyond.

Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A semiconductor laser comprising:
a first reflector, reflective of light at a desired fundamental frequency,
a semiconductor optical amplifier adjacent the first reflector;
a nonlinear crystal affixed to the amplifier; and
a second reflector, reflective of light at the fundamental frequency and transmissive of light at twice the fundamental frequency, adjacent the nonlinear crystal, the first and second reflectors defining a laser cavity that extends from the first reflector through the amplifier and the nonlinear crystal to the second reflector;
the semiconductor laser responsive to an external energy source to generate light in the laser cavity at the fundamental frequency, the nonlinear crystal doubling the frequency of the generated light and thereby providing a beam of frequency-doubled light through the second reflector.

2. A laser as in claim 1 wherein the first and second reflectors are characterized by reflectivities of more than ninety percent at the fundamental frequency.

3. A laser as in claim 1 wherein the second reflector is characterized by a transmissivity of more than fifty percent at twice the fundamental frequency.

4. A laser as in claim 1 wherein the nonlinear crystal is fused to a surface of the amplifier.

5. A laser as in claim 1 wherein the nonlinear crystal is epitaxially grown on a surface of the amplifier.

6. A laser as in claim 1 wherein the nonlinear crystal comprises a dielectric crystal.

7. A laser as in claim 6 wherein the dielectric crystal is selected from the group comprising lithium niobate and lithium tantalate.

8. A laser as in claim 1 wherein the nonlinear crystal comprises a semiconductor.

9. A laser as in claim 8 wherein the nonlinear crystal is selected from the group comprising AlGaAs, AlGaInAs, AlGaInP, AlGaInBN and MgCdZnSSe.

10. A laser as in claim 1 and further comprising, between the amplifier and the nonlinear crystal, an anti-reflection region for minimizing any reflection of fundamental-frequency light propagating between the amplifier and the crystal..

11. A laser as in claim 10 wherein the anti-reflection region is transmissive of light at the fundamental frequency but reflective of light at twice the fundamental frequency and operative to reflect toward the second reflector any frequency-doubled light that propagates from the nonlinear crystal toward the amplifier.

12. A laser as in claim 1 and further comprising, between the amplifier and the nonlinear crystal, a layer transmissive of light at the fundamental frequency but reflective of light at twice the fundamental frequency and operative to reflect toward the second reflector any frequency-doubled light that propagates from the nonlinear crystal toward the amplifier.

13. A laser as in claim 1 wherein the amplifier and the first and second reflectors are configured to define a vertical-cavity surface-emitting laser, the laser further comprising:
a substrate, the first reflector being located adjacent the substrate;
a first electrode adjacent the substrate; and
a second electrode opposite the first electrode such that the amplifier is disposed between the two electrodes, the second electrode shaped to permit light to be emitted from the laser through the second reflector.

14. A laser as in claim 1 wherein the amplifier and the first and second reflectors are configured to define an edge-emitting laser with the first reflector adjacent a first edge of the amplifier and the nonlinear crystal connected to a second edge of the amplifier, the laser further comprising:
a substrate that carries the amplifier;
a first electrode adjacent the substrate; and
a second electrode adjacent the amplifier opposite the substrate such that the amplifier is between the two electrodes.

15. A method of fabricating a vertical-cavity surface-emitting semiconductor laser, the method comprising:
epitaxially growing a first reflector on a substrate, the first reflector reflective of light at a desired fundamental frequency;

epitaxially growing a semiconductor optical amplifier on the first reflector;

attaching a nonlinear crystal to the amplifier; and depositing a second reflector on the nonlinear crystal, the second reflector reflective of light at the fundamental frequency but transmissive of light at twice the fundamental frequency, the first and second reflectors defining a laser cavity that extends from the first reflector through the amplifier and the nonlinear crystal to the second reflector.

16. A method as in claim 15 and further comprising, prior to the step of attaching the nonlinear crystal, the step of depositing an anti-reflective coating on the amplifier in such a location that after the step of attaching the nonlinear crystal the anti-reflective coating is located between the amplifier and the nonlinear crystal, the anti-reflective coating operative to minimize any reflection of fundamental-frequency light that propagates between the amplifier and the nonlinear crystal.

17. A method as in claim 16 wherein the anti-reflective coating is characterized by a transmissivity of more than ninety percent at the fundamental frequency and a reflectivity of more than fifty percent at twice the fundamental frequency.

18. A method as in claim 15 wherein the step of attaching the nonlinear crystal comprises fusing the nonlinear crystal to the amplifier.

19. A method as in claim 15 wherein the step of attaching the nonlinear crystal comprises epitaxially growing the nonlinear crystal on the amplifier.

20. A method of fabricating a vertical-cavity surface-emitting semiconductor laser, the method comprising:

epitaxially growing a semiconductor optical amplifier on a substrate;

attaching a nonlinear crystal to the optical amplifier;

etching an opening through the substrate to the semiconductor optical amplifier;

depositing a first reflector in the opening adjacent the optical amplifier, the first reflector reflective of light at a desired fundamental frequency; and depositing a second reflector on the nonlinear crystal, the second reflector reflective of light at the fundamental frequency but transmissive of light at twice the fundamental frequency, the first and second reflectors defining a laser cavity that extends from the first reflector through the amplifier and the nonlinear crystal to the second reflector.

21. A method as in claim 20 and further comprising, prior to the step of attaching the nonlinear crystal, the step of depositing an anti-reflective coating on the amplifier in such a location that after the step of attaching the nonlinear crystal the anti-reflective coating is located between the amplifier and the nonlinear crystal, the anti-reflective coating operative to minimize any reflection of fundamental-frequency light that propagates between the amplifier and the nonlinear crystal.

22. A method as in claim 21 wherein the anti-reflective coating is characterized by a transmissivity of more than ninety percent at the fundamental frequency and a reflectivity of more than fifty percent at twice the fundamental frequency.

23. A method as in claim 20 wherein the step of attaching the nonlinear crystal comprises fusing the nonlinear crystal to the amplifier.

24. A method as in claim 20 wherein the step of attaching the nonlinear crystal comprises epitaxially growing the nonlinear crystal on the amplifier.

25. A method of fabricating an edge-emitting laser, the method comprising:

epitaxially growing a semiconductor optical amplifier on a substrate;

cleaving the amplifier and substrate on opposite ends to provide first and second facets;

attaching a nonlinear crystal to the second facet;

forming a first reflector on the first facet, the first reflector reflective of light at a desired fundamental frequency; and forming a second reflector on the nonlinear crystal, the second reflector reflective of light at the fundamental frequency but transmissive of light at twice the fundamental frequency, the first and second reflectors defining a laser cavity that extends from the first reflector through the amplifier and the nonlinear crystal to the second reflector.

26. A method as in claim 25 and further comprising, prior to the step of attaching the nonlinear crystal, the step of depositing an anti-reflective coating on one of the second facet and the nonlinear crystal such that after the step of attaching the nonlinear crystal the anti-reflective coating is located between the amplifier and the nonlinear crystal, the anti-reflective coating operative to minimize any reflection of fundamental-frequency light that propagates between the amplifier and the nonlinear crystal.

27. A method as in claim 26 wherein the anti-reflective coating is characterized by a transmissivity of more than ninety percent at the fundamental frequency and a reflectivity of more than fifty percent at twice the fundamental frequency.

28. A method as in claim 25 wherein the step of attaching the nonlinear crystal comprises fusing the nonlinear crystal to the second facet.

29. A method as in claim 25 wherein the step of attaching the nonlinear crystal comprises epitaxially growing the nonlinear crystal on the second facet.

30. A vertical-cavity surface-emitting semiconductor laser comprising:

a first reflector epitaxially formed on a substrate, the first reflector reflective of light at a desired fundamental frequency;

an epitaxially-grown elongated semiconductor optical amplifier having first and second sides, the first side affixed to the first reflector;

a nonlinear crystal affixed to the second side of the amplifier; and a second reflector affixed to the nonlinear crystal, the second reflector reflective of light at the fundamental frequency but transmissive of light at twice the fundamental frequency, the first and second reflectors defining a laser cavity that extends from the first reflector through the amplifier and the nonlinear crystal to the second reflector.

31. A laser as in claim 30 and further comprising an anti-reflective coating between the amplifier and the nonlinear crystal for minimizing any reflection of fundamental-frequency light that propagates between the amplifier and the nonlinear crystal.

32. A vertical-cavity surface-emitting semiconductor laser comprising:

an elongated semiconductor optical amplifier epitaxially formed on a substrate;

a first reflector affixed to a first side of the amplifier through an opening in the substrate, the first reflector reflective of light at a desired fundamental frequency;

a nonlinear crystal affixed to a second side of the optical amplifier; and a second reflector affixed to the nonlinear crystal, the second reflector reflective of light at the fundamental frequency but transmissive of light at twice the fundamental frequency, the first and second reflectors defining a laser cavity that extends from the first reflector through the amplifier and the nonlinear crystal to the second reflector.

33. A laser as in claim 32 and further comprising an anti-reflective coating between the amplifier and the nonlinear crystal for minimizing any reflection of fundamental-frequency light that propagates between the amplifier and the nonlinear crystal.

34. An edge-emitting laser comprising:

a semiconductor optical amplifier epitaxially grown on a substrate and cleaved on opposite ends to provide first and second facets;

a first reflector formed on the first face, the first reflector reflective of light at a desired fundamental frequency;

a nonlinear crystal affixed to the second facet;

a second reflector formed on the nonlinear crystal, the second reflector reflective of light at the fundamental frequency but transmissive of light at twice the fundamental frequency, the first and second reflectors defining a laser cavity that extends from the first reflector through the amplifier and the nonlinear crystal to the second reflector.

35. A laser as in claim 34 and further comprising an anti-reflective coating between the amplifier and the nonlinear crystal for minimizing any reflection of fundamental-frequency that propagates between the amplifier and the nonlinear crystal.

* * * * *

UNITED STATES PATENT AND TRADEMARK OFFICE
CERTIFICATE OF CORRECTION

PATENT NO. : 5,390,210

DATED : February 14, 1995

INVENTOR(S) : Julie E. Fouquet et al.

It is certified that error appears in the above-identified patent and that said Letters Patent is hereby corrected as shown below:

Column 3, line 13, "AlGalnP" should read -- AlGaInP --;

Column 3, line 13, "AlGalnBN" should read -- AlGaInBN --;

Column 3, line 14, "AlGalnAs" should read -- AlGaInAs --;

Column 4, line 4 "derailed" should read -- detailed --;

Column 4, line 5, "token" should read -- taken --;

Column 8, line 38, "$P_{107}$" should read -- $P_w$ --;

Column 8, line 56, "$P_{2w}($" should read -- $P_{2w}\exp($ --.

Signed and Sealed this

Third Day of November, 1998

Attest:

BRUCE LEHMAN

Attesting Officer

Commissioner of Patents and Trademarks